(12) United States Patent
Wojtyniak et al.

(10) Patent No.: US 10,374,139 B2
(45) Date of Patent: Aug. 6, 2019

(54) PRE-PRODUCT AND METHOD FOR PRODUCING A STRIP-LIKE HIGH-TEMPERATURE SUPERCONDUCTOR

(71) Applicant: BASF SE, Ludwigshafen (DE)

(72) Inventors: Brygida Wojtyniak, Meckenheim (DE); Viktor Weimann, Meckenheim (DE); Michael Baecker, Cologne (DE); Martina Falter, Swisttal-Buschhoven (DE)

(73) Assignee: BASF SE, Ludwigshafen (DE)

( * ) Notice: Subject to any disclaimer, the term of this patent is extended or adjusted under 35 U.S.C. 154(b) by 359 days.

(21) Appl. No.: 15/329,846

(22) PCT Filed: Jul. 23, 2015

(86) PCT No.: PCT/EP2015/066844
§ 371 (c)(1),
(2) Date: Jan. 27, 2017

(87) PCT Pub. No.: WO2016/016075
PCT Pub. Date: Feb. 4, 2016

(65) Prior Publication Data
US 2017/0271572 A1    Sep. 21, 2017

(30) Foreign Application Priority Data
Jul. 31, 2014    (EP) .................................... 14179212

(51) Int. Cl.
*H01L 39/12*    (2006.01)
*H01L 39/14*    (2006.01)
(Continued)

(52) U.S. Cl.
CPC ............... *H01L 39/24* (2013.01); *B05D 1/18* (2013.01); *B05D 1/265* (2013.01); *B05D 7/14* (2013.01);
(Continued)

(58) Field of Classification Search
USPC ........................... 505/230–237; 428/699–701
See application file for complete search history.

(56) References Cited

U.S. PATENT DOCUMENTS

| | | | |
|---|---|---|---|
| 2005/0178472 A1* | 8/2005 | Hong | B21C 37/047 148/98 |
| 2006/0081307 A1* | 4/2006 | Field | H01L 39/2409 148/98 |

(Continued)

FOREIGN PATENT DOCUMENTS

| | | |
|---|---|---|
| CN | 1 117 879 C | 8/2003 |
| DE | 100 05 861 A1 | 10/2000 |

(Continued)

OTHER PUBLICATIONS

International Search Report dated Oct. 23, 2015, in PCT/EP2015/066844 filed Jul. 23, 2015.
(Continued)

*Primary Examiner* — Colleen P Dunn
(74) *Attorney, Agent, or Firm* — Oblon, McClelland, Maier & Neustadt, L.L.P.

(57) ABSTRACT

The present invention relates to a precursor (1) for production of a high-temperature superconductor (HTS) in ribbon form, comprising a metallic substrate (10) in ribbon form having a first ribbon side (11) and a second ribbon side (12), wherein, on the first ribbon side (11), (a) the substrate (10) has a defined texture as template for crystallographically aligned growth of a buffer layer or an HTS layer and (b) an exposed surface of the substrate (10) is present or one or more layers (20,30) are present that are selected from the group consisting of: buffer precursor layer, pyrolyzed buffer precursor layer, buffer layer, HTS precursor layer, pyrolyzed HTS buffer precursor layer and pyrolyzed and further consolidated HTS buffer precursor layer, and, on the second ribbon side (12), at least one ceramic barrier layer (40) that (Continued)

protects the substrate (10) against oxidation or a precursor which is converted to such a layer during the HTS crystallization annealing or the pyrolysis is present, wherein, when one or more layers (20, 30) are present on the first ribbon side (11), the ceramic barrier layer (40) or the precursor thereof has a different chemical composition and/or a different texture than the layer (20) arranged on the first ribbon side (11) and directly adjoining the substrate (10). In this precursor, the barrier layer (40) is a layer that delays or prevents ingress of oxygen to the second ribbon side (12) and is composed of conductive ceramic material or a precursor which is converted to such a precursor during the HTS crystallization annealing or the pyrolysis, and the ceramic material is an electrically conductive metal oxide or an electrically conductive mixture of metal oxides, wherein the conductive metal oxide or one or more metal oxides in the conductive mixture is/are preferably metal oxide(s) doped with an extraneous metal.

12 Claims, 1 Drawing Sheet

(51) Int. Cl.
| | | |
|---|---|---|
| *B05D 1/18* | (2006.01) | |
| *B05D 1/26* | (2006.01) | |
| *H01L 39/24* | (2006.01) | |
| *B05D 7/14* | (2006.01) | |
| *H01B 12/02* | (2006.01) | |
| *H01B 12/06* | (2006.01) | |

(52) U.S. Cl.
CPC ........... *H01B 12/02* (2013.01); *H01L 39/125* (2013.01); *H01L 39/143* (2013.01); *H01L 39/2451* (2013.01); *H01L 39/2461* (2013.01); *H01B 12/06* (2013.01)

(56) References Cited

U.S. PATENT DOCUMENTS

2008/0274903 A1* 11/2008 Field ................... H01L 39/2409
                                                                                           505/431
2014/0378313 A1* 12/2014 Prusseit ................ C23C 18/122
                                                                                           505/230

FOREIGN PATENT DOCUMENTS

| | | |
|---|---|---|
| DE | 101 59 646 C1 | 4/2003 |
| DE | 101 43 680 C1 | 5/2003 |
| DE | 10 2013 210 940 B3 | 7/2014 |
| JP | 2011-113662 A | 6/2011 |

OTHER PUBLICATIONS

Europe Search Report dated Jan. 27, 2015, in Europe Application 14179212.7 filed Jul. 31, 2014.

* cited by examiner

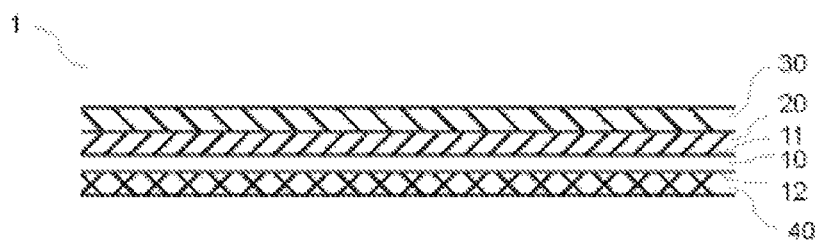

PRE-PRODUCT AND METHOD FOR PRODUCING A STRIP-LIKE HIGH-TEMPERATURE SUPERCONDUCTOR

TECHNICAL FIELD

The invention relates to a precursor and to a method for producing a high-temperature superconductor (HTS) in ribbon form, and to an HTS in ribbon form obtainable by such a method.

PRIOR ART

High-temperature superconductors in ribbon form, also referred to as coated conductors, comprise a carrier substrate in ribbon form (typically consisting of metals including precious metals, metal alloys or metal composite materials and referred to hereinafter as "metallic"), to which at least one superconductive functional layer is applied, optionally after prior application of one or more intermediate layers or buffer layers.

An essential aspect in the production of coated conductors is the requirement that the superconductive layer has to have extremely high texture, i.e. crystallographic orientation. The individual crystallites of the superconductive layer may only be tilted slightly with respect to one another, in order not to impair the superconductive properties over macroscopic lengths (High Temperature Superconductivity 1: Materials, A. V. Narlikar (ed.) Springer-Verlag, 2004, 115-167).

In order to achieve such a high level of texture, two different production approaches are pursued. In both approaches, metal substrates are used, because only in this way is it possible to achieve the strength required for the later use and simultaneously flexibility of the end products. Furthermore, in both approaches, prior to the deposition of the superconductive layer, at least one textured intermediate layer or buffer layer is produced, which transfers its texture to the superconductive layer on deposition thereof.

In the first approach, metal substrates that are not yet particularly suitable in terms of their crystallographic orientation are used as starting materials, and the buffer layer having the desired orientation is subsequently applied thereto. Such directed deposition can be effected only by means of physical coating methods, for example ion beam assisted deposition (IBAD) and inclined substrate deposition (ISD), under high vacuum. These processes are associated with a high level of apparatus complexity.

In the second approach, the metal substrate itself is textured by specific methods (see, for example, DE 101 43 680 C1 CN 1 117 879 C, DE 100 05 861 A1). This texture of the metal substrate is then transferred to the buffer layer and thence to the superconductive layer in the subsequent steps. Since no directed deposition methods have to be used for the applying of the further layers, it is possible here to use either physical methods or, in particular, chemical methods such as chemical solution deposition (CSD).

JP 2011 113662 A discloses a "metal base material for thin film superconducting wire, method of manufacturing the same, and method of manufacturing thin film superconducting wire" (title of the abstract). According to the abstract, the metal base material has two ceramic layers on the opposite sides of the superconducting wire. The two ceramic layers are produced by the heating of the metal substrates in a film-depositing device.

DE 101 59 646 C1 discloses a "method for only single-sided coating of a planar substrate with a layer of high-temperature superconductor material" (title). The substrate has been applied to just one side of the high-temperature superconductor material. The substrate forms a planarizing layer (paragraphs [0011] to [0013], [0020] and FIG. 1) on the reverse side of the high-temperature superconductor material.

DE 10 2013 210 940 B3 discloses "Coating of Technical Substrates for Manufacturing Super-Conducting Layers with High Transition Temperature" (title). Additionally disclosed is a method for applying a smoothing layer to a ribbon substrate for subsequent manufacture of a high-temperature superconductor ribbon conductor, having the steps of: (a) applying a polysilazane-comprising liquid to at least one side of the ribbon substrate; and (b) heating the polysilazane-comprising liquid to a temperature of $\geq 450°$ C. for deposition of a layer.

Both in terms of equipment and in terms of operating costs, chemical methods such as the CSD method are particularly economically viable, since they typically work at standard pressure and enable a high deposition rate. At the center of current development studies are therefore production processes for coated conductors, in which first one or more buffer layers and then the superconductive layer are applied to a textured metal substrate via chemical deposition. Subsequent crystallization of every layer applied and pyrolyzed beforehand achieves the effect that the texture of the textured layer immediately beneath in each case, or of the metal substrate, is transferred.

One function of the buffer layer(s) is to prevent the corrosion of the metal substrate by oxidation, which would result in loss of orientation at least at the metal surface; secondly, the diffusion of metal ions such as nickel or iron into the superconductive layer has to be prevented, in order not to impair the quality thereof. In the worst case, the superconductive properties of the material would be lost.

In the final HTS crystallization annealing of an HTS precursor for crystallization of the HTS precursor layer applied finally (or else even in the pyrolysis of the HTS precursor layer or a buffer layer), however, the high temperatures that are used and the oxygenous and in some cases moist atmosphere in the thermal treatment can result in damage to the textured metal substrate, especially by oxidative processes. This is not necessarily detrimental on the front side (the first ribbon side), provided that already adhering buffer layer(s) (especially nonconductive buffer layers) have already been applied thereon, and electrical connection is additionally still possible via the backside.

OBJECT OF THE INVENTION

It is therefore an object of the invention to protect an HTS precursor, especially the ribbon backside (second ribbon side), from damage by oxidative processes during the HTS crystallization annealing, or even during the pyrolysis. At the same time, electrical coupling should preferably not be prevented.

SUBJECT MATTER OF THE INVENTION

According to the invention, this object is achieved by a precursor according to the appended claims, and by a corresponding method and a corresponding HTS in ribbon form.

The invention relates (in general terms) to a precursor for production of a high-temperature superconductor (HTS) in ribbon form, comprising a metallic substrate in ribbon form having a first ribbon side and a second ribbon side, wherein, on the first ribbon side,
(a) the substrate has a defined texture as template for crystallographically aligned growth of a buffer layer or an HTS layer
and
(b) an exposed surface of the substrate is present or one or more layers are present that are selected from the group consisting of: buffer precursor layer, pyrolyzed buffer precursor layer, buffer layer, HTS precursor layer, pyrolyzed HTS buffer precursor layer and pyrolyzed and further consolidated HTS buffer precursor layer,
and,
on the second ribbon side, at least one ceramic barrier layer that protects the substrate against oxidation or a precursor which is converted to such a layer during the HTS crystallization annealing or the pyrolysis is present,
wherein, when one or more layers are present on the first ribbon side, the ceramic barrier layer or precursor thereof has a different chemical composition and/or a different texture than the layer arranged on the first ribbon side and directly adjoining the substrate.

By means of the measure envisaged in accordance with the invention of applying at least one ceramic barrier layer or a precursor thereof on the metallic underside of the HTS precursor prior to the application or pyrolysis of an HTS precursor layer (or of a buffer layer arranged beneath) or to the final thermal treatment for HTS or buffer layer crystallization annealing, it is possible to protect the textured metal substrate, for example a nickel-tungsten alloy, and especially the underside thereof, from oxidative processes in a surprisingly simple and effective manner.

In this case, the ceramic barrier layer on the backside (=second ribbon side) of the metal substrate of an HTS precursor, during the pyrolysis of the HTS precursor layer (or of a buffer layer arranged beneath) or of the final HTS or buffer layer crystallization annealing, can serve not just for protection of the underside of the substrate from oxidation and hence for the retention of its mechanical and electrical properties, but also facilitates the establishment of the desired partial oxygen pressure in the annealing atmosphere because the oxygen consumption of the unprotected metal substrate, which is otherwise residence time-dependent, is suppressed.

It is preferable that, on the first ribbon side, an individual buffer layer is present and the buffer layer has been grown on by epitaxial means, or that two or more buffer layers have been grown on by epitaxial means.

It is envisaged in this case that the ceramic barrier layer or precursor thereof has a different chemical composition and/or a different texture than any individual buffer layer arranged on the first ribbon side or any of the two or more buffer layers adjoining the substrate.

According to the invention, the ceramic barrier layer is a layer of conductive ceramic material that delays or prevents ingress of oxygen to the second ribbon side (the ceramic material being a metal oxide or a mixture of metal oxides), or a precursor which is converted to such a barrier layer during the HTS crystallization annealing or the pyrolysis is used.

It is envisaged in accordance with the invention that the ceramic material is an electrically conductive metal oxide(s) or an electrically conductive mixture of metal oxides, the conductive metal oxide or one or more metal oxides in the conductive mixture preferably being metal oxide(s) doped with an extraneous metal.

The conductive metal oxide doped with an extraneous metal is preferably selected from doped zinc oxide (preferably Al-doped zinc oxide), doped indium oxide (preferably Sn-doped indium oxide, e.g. 90% $In_2O_3$, 10% $SnO_2$), niobium-doped strontium titanate and doped lanthanum nickelate. The terms "conductive" and "conductivity" always relate in this application to electrical conductivity.

Any conductive ceramic barrier layer on the second ribbon side need not be removed again after the HTS crystallization annealing prior to the attachment of the shunt, since there is conductivity on the second ribbon side.

The doping level of the metal oxide doped with an extraneous metal is preferably at least 1%, based on the total number of metal ions in the barrier layer. It is more preferable that the doping level of the metal oxide doped with an extraneous metal is at least 5%.

In the case of alternative use of a ceramic barrier layer composed of nonconductive metal oxide, this layer composed of nonconductive metal oxide is preferably easily removable after the HTS crystallization annealing. Details relating to this aspect are given further down, with reference to preferred processes. The removing of the barrier layer or the oxide layer is necessary in the case of an insufficiently conductive execution of this barrier layer with simultaneous use of at least one buffer layer which is itself insufficiently conductive on the HTS side, in order to restore electrical conductivity at right angles to the layer structure and hence electrical connection capacity of the HTS.

It is particularly preferable here that the thickness of the layer composed of nonconductive metal oxide is not more than 10% of the thickness of the substrate. The nonconductive metal oxide is preferably selected from the group consisting of lanthanum zirconate (e.g. $La_2Zr_2O_7$), yttrium oxide (e.g. $Y_2O_3$), lanthanum aluminate (e.g. $LaAlO_3$), strontium titanate (e.g. $SrTiO_3$) and calcium titanate (e.g. $CaTiO_3$). An important selection criterion here, in addition to gas-tightness, is scratch resistance in order to assure processibility in RTR ovens. The abbreviation RTR ("reel-to-reel") means here that the processing takes place continuously from reel to reel and not in a batchwise method.

The invention also relates to a method for producing an HTS in ribbon form, having the following steps:
providing or producing a precursor of the invention (as described above, preferably as identified above as preferred, especially preferably as defined in the claims), wherein a pyrolyzed HTS precursor layer is present on the first ribbon side,
crystallization annealing of the precursor.

In a method of the invention, the ceramic barrier layer is preferably applied to the metal substrate by a CSD (chemical solution deposition) method.

CSD methods are particularly economically viable for the reasons already mentioned in the introductory part of the description.

Preferably, this CSD method is selected from the group consisting of dip coating, slot die coating and printing with subsequent heat treatment.

CSD methods and especially slot die coating via a meniscus by felt are preferably employed in the application of nonconductive ceramic barrier layers.

Preference is additionally given to a method of the invention having the following additional step: removing the ceramic barrier layer by a preferably mechanical route. Such a process configuration is advantageous especially in the case of use of a barrier layer having insufficient conductivity. Particular preference is given to configuring the removing of the barrier layer in such a way that the metallic substrate in ribbon form is not heated to a temperature exceeding 100° C. in the course of removal of the barrier layer. Moreover, dislocations in the substrate that continue as far as the HTS side should be avoided. In this way, the stripping of the barrier layer can be accomplished in a particularly economically viable manner and can additionally be controlled sufficiently precisely that the stripping is restricted to a minimum and the metal substrate exposed again as a result is damaged only to a minor degree. More particularly, damage to the HTS layer should be ruled out.

The removing of the ceramic barrier layer is preferably effected by abrasion with a diamond suspension or by blast cleaning.

According to the invention, it may also be the case that the removing of the ceramic barrier layer is effected by CMP (chemical-mechanical polishing, also referred to as chemical-mechanical planarizing), using $Al_2O_3$ in water for example.

Finally, the invention also relates to an HTS in ribbon form, obtainable by the method of the invention.

The ceramic barrier layer envisaged in accordance with the invention, in contrast to the layer(s) on the first ribbon side of the metal substrate, need not be oriented, since it does not need to transfer any texture. However, the barrier layer should be sufficiently impervious to substantially protect the metal from oxidative attack during the HTS crystallization annealing; such an attack can alter the mechanical strength and electrical and thermal conductivity of the metal substrate.

In a precursor of the invention, it is also possible for a plurality of adjoining barrier layers to be provided, in which case such a precursor is produced by, for example, first, on the second ribbon side, applying a first barrier layer of conductive or (alternatively) nonconductive ceramic material (according to the appended claims) that delays or prevents ingress of oxygen to the first ribbon side (the ceramic material preferably being a metal oxide or a mixture of metal oxides), or applying a coating which is converted to such a first barrier layer during the HTS crystallization annealing or the pyrolysis and then applying a (preferably readily detachable and/or nonconductive) second barrier layer atop this first barrier layer. If one of the two component layers consists of material having insufficient conductivity, it is generally necessary to remove at least this component layer again after the HTS annealing.

The ceramic barrier layer may consist of one of the materials which is used for any buffer layer present or the HTS layer on the surface of the metal substrate (in which case, however, it has a different chemical composition and/or a different texture than the layer arranged on the first side that directly adjoins the substrate), but also of a different material. As already mentioned, the ceramic barrier layer is a layer of conductive or (alternatively) nonconductive metal oxide (according to the appended claims) that delays or prevents ingress of oxygen to the second ribbon side, or is converted to such a layer during the HTS crystallization annealing. When the barrier layer consists of a sufficiently oxygen-impervious metal, it is preferably a baser metal than the constituents of the alloy used for the metal substrate or readily forms a sealing oxide skin.

The barrier layer need not necessarily have assumed its ultimate modification or stoichiometry prior to a customary HTS crystallization annealing of the precursor of the invention. It may be entirely acceptable or desirable in individual cases that a further oxidation or crystallization proceeds during the thermal treatment of the HTS precursor of the invention.

In the case of use of a conductive material for the barrier layer, it is possible to draw an additional benefit therefrom in the electrical coupling of the HTS in ribbon form to a metal shunt to be attached later. This is advantageous especially when at least one nonconductive oxide is used as buffer layer between metal substrate and HTS layer on the first ribbon side (HTS side).

A special case is that of the use of conductive oxides as barrier layer material, for example extraneous metal-doped metal oxides, e.g. aluminum-doped zinc oxide or tin-doped zinc oxide, in which case a doping level of at least 1%, more preferably at least 5%, may be provided. The doping increases the conductivity of the materials to, for example, $10^{-4}$ to $10^{-5}$ ohm/cm. A further alternative would be the use of a metal oxide layer which inherently already offers metallic conductivity, for example a lanthanum-nickel oxide layer.

The ceramic (oxidic) barrier layers for use in accordance with the invention preferably have conductivities of $>10^{-8}$ $Scm^{-1}$, preferably of $>10^{-6}$ $Scm^{-1}$.

As an alternative to the use of a conductive layer (as according to the appended claims), the second ribbon side (backside) of the metal substrate, prior to the HTS crystallization annealing, can be provided with any oxidic and nonconductive barrier layer. The restoration of the electrically conductive area on the first ribbon side of the metal substrate, which is necessary for the later use, is then preferably effected by a mechanical removal of the ceramic barrier layer after the HTS crystallization annealing and oxygen loading.

This can be achieved, for example, by drawing the coated second ribbon side of the metal substrate over a rotating felt impregnated with a diamond suspension. Remaining diamond particles are subsequently removed in a rinse cascade. The use of a diamond suspension having a defined mean particle size of, for example, 100 nm ensures that material is stripped only superficially.

Alternatively, the stripping of the ceramic barrier layer can be effected by blast cleaning.

In this case, it should be carefully ensured that predominantly the barrier layer is removed, and damage to the metal substrate, which is regularly softer, down to deeper regions should be avoided; this could result in propagation of dislocations down to the opposite carrier substrate surface, where it could lead to delamination of the buffer architecture.

A preferred configuration for removal of the barrier layer and the restoration of the metallic surface of the metallic substrate in ribbon form is chemical-mechanical polishing (CMP), also known as chemical-mechanical planarizing.

A barrier layer in a nonconductive execution may consist, for example, of an extremely thin (for example 20-100 nm) lanthanum zirconate layer, which can be applied in a customary manner by a CSD (chemical solution deposition) method, for example dip coating or slot die coating, to the second ribbon side (backside) of the metallic substrate in ribbon form. In the case of use of nonconductive buffer layers on the first ribbon side (frontside, HTS side), it will be necessary to remove such a nonconductive barrier layer again after the HTS crystallization annealing, in order to restore the conductivity on the backside of the metal substrate.

Alternatively—as already known from the prior art—the finished superconductor architecture can be soldered at the top and bottom to metal foils of, for example, copper or brass, which are connected at the sides with a solder which then establishes electrical contact. In this way, it is possible to construct shunt layers from different metals or alloys and in any thicknesses.

The sole FIGURE appended, FIG. 1, shows a precursor of the invention by way of example, in schematic form and is not to scale.

The precursor 1 of the invention has a metallic substrate 10 in ribbon form with a first ribbon side 11 and a second ribbon side 12. The first ribbon side 11 serves to assume the layer structure typical of an HTS, in the present example that of a single buffer layer 20 beneath an HTS layer 30.

The backside (second ribbon side) 12 of the metallic substrate 10 bears the ceramic barrier layer 40 envisaged in accordance with the invention for protection from oxidative attack.

The base invention which encompasses firstly the subject matter defined in the claims and secondly alternative subjects is elucidated in detail hereinafter, summarizing preferred aspects:

1. A precursor (1) for production of a high-temperature superconductor (HTS) in ribbon form, comprising
    a metallic substrate (10) in ribbon form having a first ribbon side (11) and a second ribbon side (12), wherein, on the first ribbon side (11),
    (a) the substrate (10) has a defined texture as template for crystallographically aligned growth of a buffer layer or an HTS layer
    and
    (b) an exposed surface of the substrate (10) is present or one or more layers (20,30) are present that are selected from the group consisting of: buffer precursor layer, pyrolyzed buffer precursor layer, buffer layer, HTS precursor layer, pyrolyzed HTS buffer precursor layer and pyrolyzed and further consolidated HTS buffer precursor layer,
    and,
    on the second ribbon side (12), at least one ceramic barrier layer (40) that protects the substrate (10) against oxidation or a precursor which is converted to such a layer during the HTS crystallization annealing or the pyrolysis is present,
    wherein, when one or more layers (20, 30) are present on the first ribbon side (11), the ceramic barrier layer (40) or precursor thereof has a different chemical composition and/or a different texture than the layer (20) arranged on the first ribbon side (11) and directly adjoining the substrate (10).
2. The precursor according to aspect 1, wherein, on the first ribbon side (11),
    a single buffer layer (20) is present and the buffer layer (20) has been grown on by epitaxial means
    or
    two or more buffer layers that have been grown on by epitaxial means are present.
3. The precursor according to either of the preceding aspects, wherein the barrier layer (40) is a layer of conductive or nonconductive ceramic material that delays or prevents ingress of oxygen to the second ribbon side (12), or a precursor which is converted to such a layer during the HTS crystallization annealing or the pyrolysis.
4. The precursor according to aspect 3, wherein the ceramic material is an electrically conductive metal oxide or an electrically conductive mixture of metal oxides, the conductive metal oxide or one or more metal oxides in the conductive mixture preferably being metal oxide(s) doped with an extraneous metal.
5. The precursor according to aspect 4, wherein the metal oxide doped with extraneous metal is selected from the group consisting of doped nickel oxide, doped indium oxide, niobium-doped strontium titanate and lanthanum nickelate.
6. The precursor according to aspect 4 or 5, wherein the doping level of the metal oxide doped with an extraneous metal is at least 1% based on the total number of metal ions in the barrier layer.
7. The precursor according to aspect 3, wherein the thickness of the layer of nonconductive metal oxide is not more than 10% of the thickness of the substrate.
8. The precursor according to either of aspects 3 and 7, wherein the nonconductive metal oxide is selected from the group consisting of lanthanum zirconate, yttrium oxide, lanthanum aluminate, strontium titanate and calcium titanate.
9. A method for producing an HTS in ribbon form, having the following steps:
    providing or producing a precursor (1) according to any of aspects 1 to 8,
    Wherein a pyrolyzed HTS precursor layer is present on the first ribbon side (11),
    crystallization annealing of the precursor (1).
10. The method according to aspect 9, wherein the ceramic barrier layer (40) is applied to the metallic substrate by a CSD (chemical solution deposition) method.
11. The method according to aspect 10, wherein the CSD method is selected from the group consisting of dip coating, slot die coating and printing.
12. The method according to any of aspects 9 to 11, having the following additional step:
    removing the ceramic barrier layer (40) by a preferably mechanical route.
13. The method according to aspect 12, wherein the ceramic barrier layer (40) is removed by abrasion with a diamond suspension or by blast cleaning.
14. The method according to aspect 13, wherein the ceramic barrier layer (40) is removed by CMP (chemical-mechanical polishing).
15. An HTS in ribbon form, obtainable by a method according to any of aspects 9 to 14.

The invention claimed is:
1. A precursor for production of a high-temperature superconductor (HTS) in ribbon form, comprising:
    a metallic substrate in ribbon form having a first ribbon side and a second ribbon side,
    wherein, on the first ribbon side,
    (a) the substrate has a defined texture as template for crystallographically aligned growth of a buffer layer or an HTS layer
    and
    (b) an exposed surface of the substrate is present or one or more layers are present that are selected from the group consisting of: buffer precursor layer, pyrolyzed buffer precursor layer, buffer layer, HTS precursor layer, pyrolyzed HTS buffer precursor layer and pyrolyzed and further consolidated HTS buffer precursor layer,
    and,
    on the second ribbon side,
    at least one ceramic barrier layer that protects the substrate against oxidation or a precursor which is con- verted to such a layer during the HTS crystallization annealing or the pyrolysis is present, wherein, when one or more layers are present on the first ribbon side, the ceramic barrier layer or the precursor thereof has a different chemical composition and/or a different texture than the layer arranged on the first ribbon side and directly adjoining the substrate, wherein the barrier layer is a layer of conductive ceramic material that delays or prevents ingress of oxygen to the second ribbon side, or a precursor which is converted to such a layer during the HTS crystallization annealing or the pyrolysis, and the ceramic material is an electrically conductive metal oxide or an electrically conductive mixture of metal oxides.

2. The precursor according to claim 1, wherein the conductive metal oxide or one or more metal oxides in the conductive mixture is/are metal oxide(s) doped with an extraneous metal.

3. The precursor according to claim 1, wherein, on the first ribbon side, a single buffer layer is present and the buffer layer has been grown on by epitaxial means or two or more buffer layers that have been grown on by epitaxial means are present.

4. The precursor according to claim 1, wherein the metal oxide doped with an extraneous metal is selected from the group consisting of doped zinc oxide, doped indium oxide, niobium-doped strontium titanate, lanthanum nickelate and mixtures thereof.

5. The precursor according to claim 1, wherein the doping level of the metal oxide doped with an extraneous metal is at least 1%, based on the total number of metal ions in the barrier layer.

6. A method for producing an HTS in ribbon form, comprising:

providing or producing a precursor according to claim 1, wherein a pyrolyzed HTS precursor layer is present on the first ribbon side, crystallization annealing of the precursor.

7. The method according to claim 6, wherein the ceramic barrier layer is applied to the metallic substrate by a CSD (chemical solution deposition) method.

8. The method according to claim 7, wherein the CSD method is selected from the group consisting of dip coating, slot die coating, printing ng combinations thereof.

9. The method according to claim 6, comprising:

removing the ceramic barrier layer by a mechanical route.

10. The method according to claim 9, wherein the ceramic barrier layer is removed by abrasion with a diamond suspension or by blast cleaning.

11. The method according to claim 10, wherein the ceramic barrier layer is removed by CMP (chemical-mechanical polishing).

12. An HTS in ribbon form, obtainable by a method according to claim 6.

* * * * *

UNITED STATES PATENT AND TRADEMARK OFFICE
CERTIFICATE OF CORRECTION

| | | |
|---|---|---|
| PATENT NO. | : 10,374,139 B2 | Page 1 of 1 |
| APPLICATION NO. | : 15/329846 | |
| DATED | : August 6, 2019 | |
| INVENTOR(S) | : Brygida Wojtyniak et al. | |

It is certified that error appears in the above-identified patent and that said Letters Patent is hereby corrected as shown below:

On the Title Page

Column 2, item (57), Abstract, Line 9, delete "(20,30)" and insert -- (20, 30) --, therefor.

In the Claims

Column 10, Line 19, Claim 8, delete "ng" and insert -- and --, therefor.

Signed and Sealed this
Twelfth Day of May, 2020

Andrei Iancu
*Director of the United States Patent and Trademark Office*